US00RE43782E

(19) United States
(12) Reissued Patent
Koyama et al.

(10) Patent Number: US RE43,782 E
(45) Date of Reissued Patent: Nov. 6, 2012

(54) ACTIVE MATRIX DISPLAY DEVICE HAVING WIRING LAYERS WHICH ARE CONNECTED OVER MULTIPLE CONTACT PARTS

(75) Inventors: Jun Koyama, Kanagawa (JP); Hisashi Ohtani, Kanagawa (JP); Yasushi Ogata, Tochigi (JP); Shunpei Yamazaki, Tokyo (JP)

(73) Assignee: Semiconductor Energy Laboratory Co., Ltd., Atsugi-shi, Kanagawa-ken (JP)

(21) Appl. No.: 10/960,897

(22) Filed: Oct. 8, 2004

Related U.S. Patent Documents

Reissue of:
(64) Patent No.: 6,630,687
Issued: Oct. 7, 2003
Appl. No.: 09/652,652
Filed: Aug. 31, 2000

U.S. Applications:
(63) Continuation of application No. 08/996,357, filed on Dec. 22, 1997, now Pat. No. 6,124,604.

(30) Foreign Application Priority Data

Dec. 30, 1996 (JP) ..... 8-358956

(51) Int. Cl.
*H01L 29/04* (2006.01)
*H01L 29/15* (2006.01)
*H04B 10/00* (2006.01)

(52) U.S. Cl. ..... 257/72; 257/59; 257/347; 398/132

(58) Field of Classification Search ..... 257/72, 257/59, 347; 398/132
See application file for complete search history.

(56) References Cited

U.S. PATENT DOCUMENTS

| | | | |
|---|---|---|---|
| 4,914,503 | A | 4/1990 | Shirato et al. |
| 5,075,674 | A | 12/1991 | Katayama et al. |
| 5,182,620 | A | 1/1993 | Shimada et al. |
| 5,200,846 | A | 4/1993 | Hiroki et al. |
| 5,483,082 | A | 1/1996 | Takizawa et al. |
| 5,491,352 | A | 2/1996 | Tsuji |
| 5,530,266 | A | 6/1996 | Yonehara et al. |

(Continued)

FOREIGN PATENT DOCUMENTS

EP 0 318 224 5/1989

(Continued)

OTHER PUBLICATIONS

Office Action (U.S. Appl. No. 10/620,565), Oct. 18, 2005, 11 pages.

(Continued)

*Primary Examiner* — Zandra Smith
*Assistant Examiner* — Tsz K Chiu
(74) *Attorney, Agent, or Firm* — Fish & Richardson P.C.

(57) ABSTRACT

A wiring line to which a high-frequency signal is applied is electrically connected in parallel to an auxiliary wiring line via a plurality of contact holes. The contact holes are formed through an interlayer insulating film and arranged in vertical direction to the wiring line. Since the auxiliary wiring line is formed in the same layer as an electrode that constitutes a TFT, the electric resistance of the wiring line can be reduced effectively and waveform rounding of an applied high-frequency signal can be reduced without increasing the number of manufacturing steps.

38 Claims, 5 Drawing Sheets

[AMENDED]

[AMENDED]

U.S. PATENT DOCUMENTS

| | | | | |
|---|---|---|---|---|
| 5,530,573 | A | | 6/1996 | Shimada |
| 5,550,070 | A | * | 8/1996 | Funai et al. ..... 438/486 |
| 5,581,092 | A | | 12/1996 | Takemura |
| 5,585,951 | A | | 12/1996 | Noda et al. |
| 5,608,232 | A | | 3/1997 | Yamazaki et al. |
| 5,610,414 | A | | 3/1997 | Yoneda et al. |
| 5,631,756 | A | | 5/1997 | Itazawa |
| 5,636,329 | A | | 6/1997 | Sukegawa et al. |
| 5,639,698 | A | | 6/1997 | Yamazaki et al. |
| 5,643,826 | A | | 7/1997 | Ohtani et al. |
| 5,644,147 | A | | 7/1997 | Yamazaki et al. |
| 5,686,328 | A | | 11/1997 | Zhang et al. |
| 5,708,485 | A | | 1/1998 | Sato et al. |
| 5,739,549 | A | * | 4/1998 | Takemura et al. ..... 257/59 |
| 5,744,820 | A | | 4/1998 | Matsushima et al. |
| 5,757,456 | A | | 5/1998 | Yamazaki et al. |
| 5,780,872 | A | | 7/1998 | Misawa et al. |
| 5,784,132 | A | | 7/1998 | Hashimoto |
| 5,804,501 | A | | 9/1998 | Kim |
| 5,818,070 | A | | 10/1998 | Yamazaki et al. |
| 5,818,550 | A | | 10/1998 | Kadota et al. |
| 5,821,138 | A | | 10/1998 | Yamazaki et al. |
| 5,827,755 | A | | 10/1998 | Yonehara et al. |
| 5,834,327 | A | | 11/1998 | Yamazaki et al. |
| 5,835,177 | A | | 11/1998 | Dohjo et al. |
| 5,854,096 | A | | 12/1998 | Ohtani et al. |
| 5,879,977 | A | | 3/1999 | Zhang et al. |
| 5,897,347 | A | | 4/1999 | Yamazaki et al. |
| 5,899,547 | A | * | 5/1999 | Yamazaki et al. ..... 349/43 |
| 5,923,962 | A | | 7/1999 | Ohtani et al. |
| 5,929,948 | A | | 7/1999 | Ohori et al. |
| 5,943,107 | A | | 8/1999 | Kadota et al. |
| 5,956,579 | A | | 9/1999 | Yamazaki et al. |
| 5,966,190 | A | | 10/1999 | Dohjo et al. |
| 5,985,746 | A | | 11/1999 | Kapoor |
| 6,005,648 | A | | 12/1999 | Zhang et al. |
| 6,008,065 | A | | 12/1999 | Lee et al. |
| 6,028,652 | A | | 2/2000 | Dohjo et al. |
| 6,072,556 | A | | 6/2000 | Hirakata et al. |
| 6,078,366 | A | | 6/2000 | Dohjo et al. |
| 6,084,247 | A | | 7/2000 | Yamazaki et al. |
| 6,110,770 | A | | 8/2000 | Zhang et al. |
| 6,124,604 | A | | 9/2000 | Koyama et al. |
| 6,166,396 | A | | 12/2000 | Yamazaki |
| 6,184,068 | B1 | | 2/2001 | Ohtani et al. |
| 6,198,133 | B1 | | 3/2001 | Yamazaki et al. |
| 6,198,517 | B1 | | 3/2001 | Ohori et al. |
| 6,239,854 | B1 | | 5/2001 | Hirakata et al. |
| 6,285,042 | B1 | | 9/2001 | Ohtani et al. |
| 6,326,248 | B1 | | 12/2001 | Ohtani et al. |
| 6,335,541 | B1 | | 1/2002 | Ohtani et al. |
| 6,376,333 | B1 | | 4/2002 | Yamazaki et al. |
| 6,384,818 | B1 | | 5/2002 | Yamazaki et al. |
| 6,451,638 | B1 | | 9/2002 | Zhang et al. |
| 6,589,824 | B2 | | 7/2003 | Ohtani et al. |
| 6,630,687 | B1 | | 10/2003 | Koyama et al. |
| 6,919,237 | B2 | | 7/2005 | Ohtani et al. |
| 6,997,985 | B1 | | 2/2006 | Yamazaki et al. |
| 6,998,282 | B1 | | 2/2006 | Yamazaki et al. |
| 6,998,639 | B2 | | 2/2006 | Ohtani et al. |
| 7,102,169 | B2 | | 9/2006 | Koyama et al. |
| 7,323,717 | B2 | | 1/2008 | Koyama et al. |
| 7,361,519 | B2 | | 4/2008 | Yamazaki et al. |
| 7,375,782 | B2 | | 5/2008 | Yamazaki et al. |
| 7,550,325 | B2 | | 6/2009 | Koyama et al. |
| 2001/0022677 | A1 | | 9/2001 | Hirakata et al. |
| 2001/0052954 | A1 | | 12/2001 | Ohori et al. |
| 2004/0263712 | A1 | | 12/2004 | Yamazaki et al. |
| 2005/0052584 | A1 | | 3/2005 | Yamazaki et al. |
| 2005/0239240 | A1 | | 10/2005 | Ohtani et al. |
| 2006/0131583 | A1 | | 6/2006 | Ohtani et al. |
| 2009/0231533 | A1 | | 9/2009 | Koyama et al. |

FOREIGN PATENT DOCUMENTS

| | | | |
|---|---|---|---|
| EP | 0 530 972 | A2 | 3/1993 |
| EP | 0 603 866 | | 6/1994 |
| EP | 0 612 102 | A2 | 8/1994 |
| EP | 0 651 431 | | 5/1995 |
| EP | 0 708 355 | | 4/1996 |
| EP | 0 708 356 | | 4/1996 |
| EP | 1 119 053 | A2 | 7/2001 |
| EP | 1 158 580 | | 11/2001 |
| JP | 59-005672 | | 1/1984 |
| JP | 62-209514 | | 9/1987 |
| JP | 64-062617 | | 3/1989 |
| JP | 01-134343 | | 5/1989 |
| JP | 01-134344 | | 5/1989 |
| JP | 03-182723 | | 8/1991 |
| JP | 04-172325 | | 6/1992 |
| JP | 04-178633 | | 6/1992 |
| JP | 04-179927 | | 6/1992 |
| JP | 04-313729 | | 11/1992 |
| JP | 05-045643 | | 2/1993 |
| JP | 05-053127 | | 3/1993 |
| JP | 05-150264 | | 6/1993 |
| JP | 05-190600 | | 7/1993 |
| JP | 05-210090 | | 8/1993 |
| JP | 05-241200 | * | 9/1993 |
| JP | 5-273591 | A | 10/1993 |
| JP | 05-303080 | | 11/1993 |
| JP | 05-323373 | | 12/1993 |
| JP | 06-034996 | | 2/1994 |
| JP | 06-069503 | | 3/1994 |
| JP | 06-138488 | | 5/1994 |
| JP | 06-160904 | | 6/1994 |
| JP | 06-232345 | | 8/1994 |
| JP | 06-242433 | | 9/1994 |
| JP | 06-244103 | A | 9/1994 |
| JP | 06-244104 | A | 9/1994 |
| JP | 06-250221 | | 9/1994 |
| JP | 07-013145 | | 1/1995 |
| JP | 07-043736 | A | 2/1995 |
| JP | 07-092478 | A | 4/1995 |
| JP | 07-098575 | | 4/1995 |
| JP | 7-120788 | A | 5/1995 |
| JP | 07-140485 | | 6/1995 |
| JP | 07-169967 | | 7/1995 |
| JP | 07-175038 | | 7/1995 |
| JP | 07-183540 | | 7/1995 |
| JP | 07-209663 | | 8/1995 |
| JP | 07-225391 | A | 8/1995 |
| JP | 07-281206 | A | 10/1995 |
| JP | 07-294870 | | 11/1995 |
| JP | 07-318902 | | 12/1995 |
| JP | 07-321335 | | 12/1995 |
| JP | 08-062581 | | 3/1996 |
| JP | 08-069968 | | 3/1996 |
| JP | 08-078329 | | 3/1996 |
| JP | 08-095083 | | 4/1996 |
| JP | 08-122768 | | 5/1996 |
| JP | 08-122824 | | 5/1996 |
| JP | 08-139333 | | 5/1996 |
| JP | 08-167572 | | 6/1996 |
| JP | 08-179376 | | 7/1996 |
| JP | 8-211855 | A | 8/1996 |
| JP | 08-220518 | | 8/1996 |
| JP | 08-254714 | | 10/1996 |
| JP | 08-262474 | | 10/1996 |
| JP | 08-288522 | | 11/1996 |
| JP | 08-328000 | | 12/1996 |
| JP | 08-338998 | | 12/1996 |
| JP | 9-160076 | A | 6/1997 |
| JP | 10-198292 | A | 7/1998 |

OTHER PUBLICATIONS

U.S. Office Action issued in U.S. Appl. No. 10/620,565 dated Mar. 31, 2005, 8 pages.

U.S. Appl. No. 10/620,565, filed Jul. 17, 2003, Publication Date May 6, 2004, Koyama et al.

Pending U.S. Appl. No. 10/803,965, filed Mar. 19, 2004, Koyama et al.

Pending U.S. Appl. No. 10/850,117, filed May 21, 2004, Koyama et al.

Office Action (U.S. Appl. No. 10/803,965), Aug. 11, 2004; 7 pages.

Japan 64-062617—English Abstract: esp@cenet.com.

Japan 04-172325—English Abstract: esp@cenet.com.
Japan 05-045643—English Abstract: esp@cenet.com.
Japan 05-303080—English Abstract: esp@cenet.com.
Japan 05-323373—English Abstract: esp@cenet.com.
Japan 06-242433—English Abstract: esp@cenet.com and family to U.S. Patent No. 5,585,951 (Desig. ID"AC") and European Patent Application No. 0 603 866 (Desig. ID "AI").
Japan 07-013145—Full English Translation.
Japan 07-140485—English Abstract: esp@cenet.com and family to U.S. Patent No. 5,686,328 (Desig. ID "AD").
Japan 07-169967—English Abstract: esp@cenet.com.
Japan 07-209663—English Abstract: esp@cenet.com.
Japan 08-122768—English Abstract: esp@cenet.com and family to U.S. Patent No. 5,784,132 (Desig. ID "AE") and European Patent Application No. 0 708 355 (Desig. ID"AJ").
Japan 08-122824—English Abstract: esp@cenet.com and family to U.S. Patent No. 5,818,550 (Desig. ID "AF"), U.S. Patent No. 5,943,107 (Desig. ID "AH") and European Patent Application No. 0 708 356 (Desig. ID "AK").
Japan 08-139333—English Abstract: esp@cenet.com.
Japan 08-179376—English Abstract: esp@cenet.com.
Japan 08-220518—English Abstract: esp@cenet.com.
Japan 08-262474—English Abstract: esp@cenet.com and family to U.S. Patent No. 5,834,327 (Desig. ID "AG"), U.S. Patent Application Publication No. 2004-0263712 (Desig. ID "AA") and U.S. Patent Application Publication No. 2005-0052584 (Deisg. ID "AB").

* cited by examiner

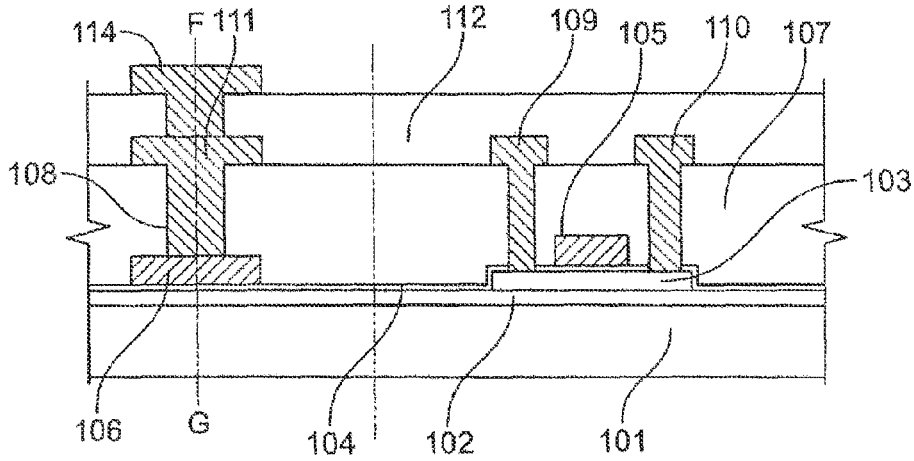
FIG. 1A [AMENDED]
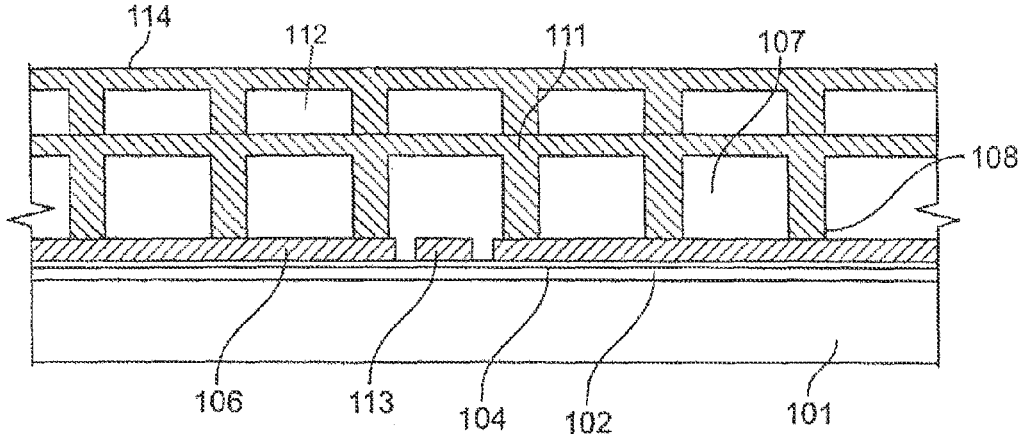
FIG. 1B [AMENDED]
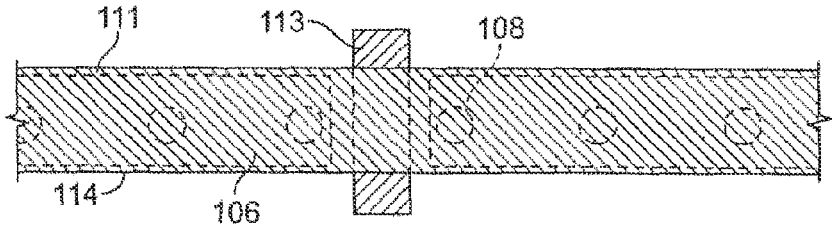
FIG. 1C [AMENDED]

ACTIVE MATRIX DISPLAY DEVICE HAVING WIRING LAYERS WHICH ARE CONNECTED OVER MULTIPLE CONTACT PARTS

Matter enclosed in heavy brackets [ ] appears in the original patent but forms no part of this reissue specification; matter printed in italics indicates the additions made by reissue.

This is a continuation of U.S. application Ser. No. 08/996,357, filed. Dec. 22, 1997, now U.S. Pat. No. [6,124,664 (allowed)] *6,124,604*.

BACKGROUND OF THE INVENTION

1. Field of the Invention

The present invention relates to a wiring structure of an integrated circuit that is formed on a substrate having an insulating surface by using thin film transistors (hereinafter called TFTs). The invention also relates to a wiring structure of a liquid crystal display device of a peripheral circuits integration type that is formed on a substrate having an insulating surface by using TFTs.

2. Description of the Related Art

A technique is known in which a silicon film having crystallinity is formed on a glass substrate or a quartz substrate and a TFT is formed by using the silicon film thus formed. This type of TFT is called "high-temperature polysilicon TFT" or "low-temperature polysilicon TFT."

The high-temperature polysilicon TFT is formed on a highly heat-resistant substrate such as a quartz substrate because in order to obtain a crystalline silicon film with an active layer heating at 800° C. to 900° C. is required. On the other hand, the low-temperature polysilicon TFT is formed on a substrate that is relatively low in heat resistance such as a glass substrate by a process requiring less than 600° C.

A high-temperature polysilicon TFT has the advantage that TFTs similar in characteristics can easily be integrated [*i 25] on a substrate, and that it can be manufactured by utilizing the various process conditions and manufacturing apparatuses of conventional IC processes. On the other hand, a low-temperature polysilicon TFT has the advantage that a glass substrate may be used that is inexpensive and can easily be increased in size (large-area substrate).

According to current technologies, there are no large differences in characteristics between a high temperature polysilicon TFT and the low-temperature polysilicon TFT. Both types of TFTs provide mobility values of about 50 to 100 $cm^2/Vs$ and S-values of about 200 to 400 mV/dec ($V_D$=1 V).

Techniques of producing a liquid crystal display device where integrated circuits, an active matrix circuit, and peripheral circuits for driving the active matrix circuit are formed on the same substrate (also known as a peripheral circuits integration type liquid crystal display device) are now being studied.

However, the characteristics of conventional high-temperature polysilicon and low-temperature polysilicon [TFT] *TFTs* are much poorer than those of a MOS transistor formed on a single crystal silicon wafer. Typically, a MOS transistor formed on a single crystal silicon wafer yields an S-value of 60 to 70 mV/dec.

Furthermore, in both high-temperature polysilicon and low-temperature polysilicon TFTs according to the current technologies, because of low mobility, the driving frequency of such TFTs is obliged to be less than several megahertz.

For example, where peripheral circuits of a liquid crystal display device are formed by using high-temperature or low-temperature polysilicon TFTs, it is impossible to directly input, (to drive the TFTs), a clock signal or a video signal of more than tens of megahertz necessary for display.

For the above reason, a plurality of wiring lines (interconnections) are used to transmit clock signals or video signals and the clock signals or video signals are supplied to the TFTs in such a manner as to be reduced in frequency (called divisional driving). For example, a 10-MHz frequency of an original clock signal is divided into 2.5 MHz by using four wiring lines. The respective TFTs are driven at this low frequency. This increases the number of wiring lines and the number of TFTs, resulting in problems such as increased installation area.

The present inventors have developed a TFT which exhibits performance equivalent to that of a MOS transistor formed on a single crystal silicon wafer though it uses a crystalline silicon film.

Such a TFT uses a crystalline silicon film having a crystal structure that is continuous in a predetermined direction, for instance, in the source-drain direction as well as having grain boundaries extending in the same, predetermined direction.

This type of crystalline silicon film is obtained by introducing a very small amount of a metal element (for instance, nickel) for accelerating crystallization into an amorphous silicon film, then heating the amorphous silicon film at 500° to 630° C. (for instance, 600° C.) to cause lateral crystal growth, and thereafter forming a thermal oxidation film.

Having much superior characteristics such as an S-value of smaller than 100 mV/dec and mobility of higher than 200 $cm^2/Vs$, this type of TFT, in itself, can be driven at tens to hundreds of megahertz or even higher frequencies. By using this type of TFT, TFTs capable of being driven at high speed can be integrated on a large-area substrate.

As a result, not only can circuits having much superior performance be obtained but also the numbers of thin-film transistors and wiring lines necessary [or] *for* driving can be reduced to a large extent from the conventional cases, thereby greatly contributing to miniaturization and increase in the degree of integration of devices.

However, where an integrated circuit is formed by using TFTs over such a large area as a several centimeter square to a tens of centimeter square as in the case of the peripheral circuits integration type active matrix liquid crystal display device, the rounding of high-frequency signals that are transmitted by wiring lines becomes a very serious problem when such integrated circuit is driven at a high frequency such as tens to hundreds of megahertz or higher.

This problem will be described below for peripheral circuits of a liquid crystal display device. FIG. 5 is a top view of a peripheral circuits integration type active matrix liquid crystal display device.

As shown in FIG. 5, an opposed substrate 902 having an opposed electrode (not shown) on its inside surface is opposed to a substrate 901 with liquid crystal material (not shown) interposed in between.

A data lines (source lines) driving peripheral circuit 903, a scanning lines (gate lines) driving peripheral circuit 904, and an active matrix display section 905 in which respective pixels are provided with pixel electrodes and switching TFTs that are connected to the respective pixel electrodes are provided on the substrate 901.

A flat cable 906, which extends from external circuits to supply signals to the liquid crystal display device, is electrically connected to peripheral wiring lines 907 at an end portion of the substrate 901. The peripheral wiring lines 907 are connected to wiring lines [9] *908* and 909 in the peripheral circuits 903 and 904. The peripheral wiring lines 907 and the wiring lines 908 and 909 in the peripheral circuits 903 and 904 are arranged parallel or approximately parallel with each other.

The wiring lines 907 to 909 are formed as thin films of a conductive material such as aluminum, and at the same time as the TFTs of the peripheral circuits 903 and 904 and the active matrix circuit of the display section 905.

Part of the wiring lines 907 to 909 are used for transmitting a signal of a very high frequency, for instance, more than 10 MHz. Typical examples of those wiring lines are a video signal line for transmitting a video signal and a clock signal line for supplying a clock signal.

In general, the clock signal frequency amounts to about 12.5 MHz in the case of VGA (640×480×3 (three colors of RGB) pixels), and the video signal frequency increases with the clock signal frequency, such as when the image resolution becomes higher.

In particular, in the peripheral circuits integration type liquid crystal display device, the peripheral circuits 903 and 904 which drive the display section 905 which might be several centimeter square to a tens of centimeter square are usually provided alongside display section 905 and hence have similar length.

Each of the peripheral circuits 903 and 904 has wiring lines that extend from one end to the other within the circuit. The clock signal line and the video signal line are examples of such wiring lines. Such wiring lines may have a length of several centimeters to tens of centimeters inside the peripheral circuits 903 and 904.

The electric resistance of long wiring lines becomes very high even if made of a material having high electric conductivity, such as aluminum.

The peripheral wiring lines 907 for transmitting signals from flat cable 906 to peripheral circuits 903 and 904 also have line width of tens to hundreds of micrometers and length several centimeters or more, even tens of centimeters in some cases.

In view of the length of the peripheral wiring lines 907 and the length of the wiring lines 908 and 909 in the peripheral circuits 903 and 904, it is understood that signals are transmitted by wiring lines of length not available in such scale in conventional IC chips.

On the other hand, capacitance coupling is likely to occur in parallel-arranged wiring lines when a high-frequency signal is applied [thereto-because] *thereto because* they are distant from each other by only tens to hundreds of micrometers.

Further, in the liquid crystal display device, the opposed electrode (not shown) is provided on the entire surface of the opposed substrate 902. From the viewpoints of protecting the peripheral circuits 903 and 904 and simplifying the manufacturing process, it is common design to provide not only the display section 905 but also the peripheral circuits 903 and 904 and the peripheral wiring lines 907 on the surface that confronts the opposed substrate 902. Therefore, the opposed electrode confronts the peripheral wiring lines 907 and the wiring lines 908 and 909 in the peripheral circuits 903 and 904, and hence capacitance coupling may occur between the opposed electrode and the above wiring lines.

The capacitances formed between wiring lines or between wiring lines and the opposed electrode (provided on the inside surface of the opposed substrate 902 that confronts the substrate 901 via the liquid crystal) and the high resistance of each wiring line cause deterioration, i.e., rounding, of a transmission signal waveform. That is, a signal that is transmitted by a wiring line, even when it has a good shape (for instance, a rectangular shape) at the input stage, is more rounded (the rising position of the waveform is delayed or the waveform is disordered) as it reaches the end of the wiring line.

When a signal waveform is rounded to a large extent, a delay may occur in the operation timing of a circuit or erroneous video information transmitted to pixels, possibly resulting in erroneous operation or a disordered image.

This problem becomes more serious as the size of the display section 905 increases or the driving frequency is increased such as by increasing the display resolution.

Among the peripheral circuits 903 and 904, the rounding has a great influence, i.e., is a serious problem in the circuit 903 when driving the data lines (source lines) because it is supplied with high-frequency signals of tens to hundreds of megahertz.

At present, integrated circuits in the form of a chip that use a single crystal silicon wafer are also common and operate at a driving frequency of tens to hundreds of megahertz. However, in such cases, since the entire integrated circuit is accommodated in a chip of an about 1-to-2-cm square, wiring lines are short and hence the rounding is less serious than in the large-area liquid crystal display device.

To reduce the capacitance between wiring lines, it is necessary to increase the distance between the wiring lines and decrease the dielectric constant of the region between the wiring lines.

However, if the distance between wiring lines is increased, the area necessary to accommodate the wiring lines and a circuit that uses the wiring lines increases, resulting in an increase in the size of the entire device. Thinning the width of wiring lines is not favorable either however, because the electric resistance increases as the distance between the wiring lines decreases.

The distance between the wiring lines and the opposed electrode is relatively small (the interlayer insulating film is 1 to 2 μm thick and the liquid crystal layer is 3 to 8 μm thick, and hence the total thickness is about 10 μm). However, the thickness of the liquid crystal material layer, i.e., the cell gap, cannot be increased for optical reasons. It is difficult to increase the distance between the wiring lines and the opposed electrode sufficiently to obtain a desired reduction in capacitance by increasing the thickness of the interlayer insulating layer.

As described above, it is difficult for the current technologies to effectively reduce the capacitance between wiring lines.

One would think the electric resistance of wiring lines can be reduced by widening or thickening the wiring lines. However, thickening the wiring lines is unfavorable because it makes hillocks occur more easily due to heating when manufacturing. As a result, short-circuiting occurs more easily between wiring lines that cross each other via the interlayer insulating film.

SUMMARY OF THE INVENTION

The present invention has been made to solve the above problems, and an object of the invention is therefore to reduce, without increasing the capacitance, the electric resistance of wiring lines to which a high-frequency signal of several megahertz to tens of megahertz or an even higher frequency in an integrated circuit using TFTs that are formed on a relatively large substrate having an insulating surface, particularly a peripheral circuits integration type liquid crystal display device.

To attain the above object, according to one aspect of the invention, there is provided a semiconductor device in which a circuit using a thin-film transistor having an active layer that is constituted of a crystalline silicon film is provided on a substrate having an insulating surface, wherein at least part of at least one of wiring lines that are connected to the circuit and/or wiring lines in the circuit is electrically connected in parallel to an auxiliary wiring line that is provided with an interlayer insulating film interposed in between.

The above configuration is particularly effective when a high-frequency signal is applied to the at least one wiring line.

The above configuration is particularly effective when the circuit constitutes a peripheral circuit of a peripheral circuits integration type liquid crystal [di play] *display* device.

According to another aspect of the invention, there is provided a manufacturing method of a semiconductor device which method is applied to forming, on a substrate having an insulating surface, an active layer that is constituted of a crystalline silicon film and a thin-film transistor having a plurality of electrodes that are insulated from each other by an interlayer insulating film, the manufacturing method comprising the steps of forming a wiring line in a step of forming one of the plurality of electrodes; and forming an auxiliary electrode so that it is electrically connected in parallel to the wiring line in a step of forming another or other plural ones of the plurality of electrodes.

In the above method, the plurality of electrodes are a gate electrode and a source (or drain) electrode, for instance. But the invention is not limited to such a case.

BRIEF DESCRIPTION OF THE DRAWINGS

FIGS. 1A to 1C show an exemplary structure of a semiconductor device according to the present invention;

DETAILED DESCRIPTION OF THE PREFERRED EMBODIMENTS

Figures 2A, 2B, 2C, 2D:
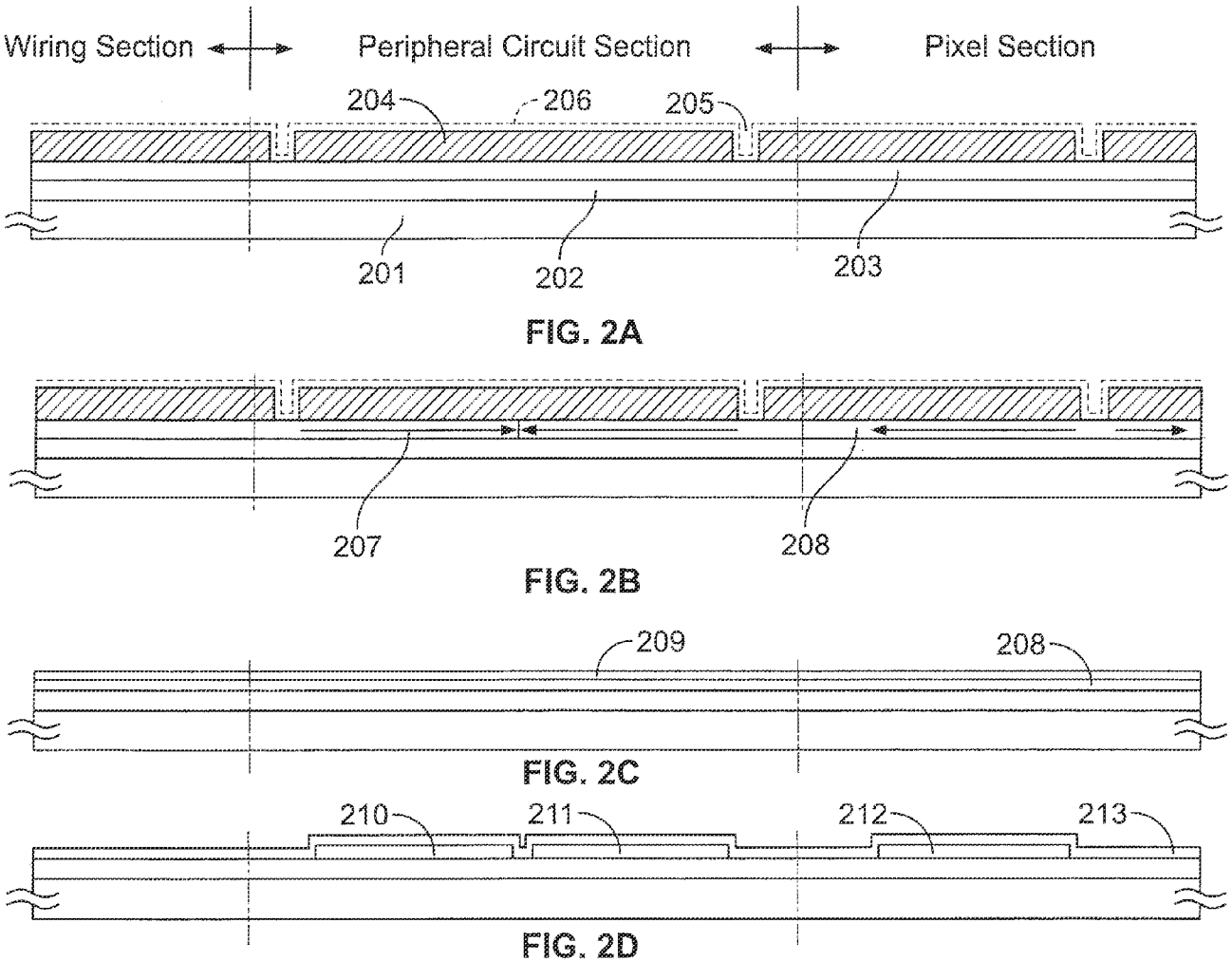
FIGS. 2A to 2D, 3A to 3E, and 4A to 4C show a manufacturing process according to the present invention.

FIGS. 1A to 1C show an exemplary structure of a semiconductor device according to the present invention. FIG. 1A is a longitudinal sectional view of a wiring line (left side) and a thin-film transistor (TFT; right side). As shown in FIG. 1A, a silicon oxide film as an undercoat film 102 is formed on a substrate 101 and a TFT is formed thereon.

The TFT is constituted of an active layer 103 that is a crystalline silicon film, a gate insulating film 104, a gate electrode 105, a source electrode 109, and a drain electrode 110. Reference numerals 107 and 112 denote interlayer insulating films. Contact holes 108 are formed through the interlayer insulating film 107.

Referring to FIG. 1A, a wiring line 111 is connected in parallel to an auxiliary wiring line 106 via a plurality of contact holes 108 that are formed through the interlayer insulating film 107.

While conventionally a wiring line is constituted of only one layer, i.e., the wiring line 111, in the structure of FIGS. 1A to 1C the auxiliary wiring line 106 is provided in the same layer as the gate electrode 105. Further, a two-layer structure is established in such a manner that the wiring line 111 is electrically connected in parallel to the auxiliary wiring line 106 via the plurality of contact holes 108 formed in the interlayer insulating film 107 along the longitudinal direction of the wiring line 111. Naturally, another auxiliary wiring line *114* may also be provided electrically connected *through a plurality of contact holes* in parallel to the wiring line 111 with another interlayer insulating film, for instance, a film 112, interposed in between.

The auxiliary wiring line 106 shown in FIGS. 1A to 1C can be formed at the same time as the gate electrode 105. That is, the auxiliary wiring line 106 can be obtained at the same time when a thin film of a conductive material is patterned to form the gate electrode 105. Therefore, in the structure of FIGS. 1A to 1C, the gate electrode 105 and the auxiliary wiring line 106 are made of the same material.

FIG. 1B is a sectional view taken along line F to G in FIG. 1A. As shown in FIG. 1B, the wiring line 111 and the auxiliary wiring line 106 are in electrical contact with each other at a plurality of positions and are thereby electrically connected to each other in parallel.

As the number of contact holes 108 for connecting the wiring line 111 and the auxiliary wiring line 106 increases, the electrical connection between the wiring line 111 and the auxiliary wiring line 106 becomes better, that is, the contact resistance decreases, whereby the electric resistance of the combination of the wiring line 111 and the auxiliary wiring line 106 decreases.

High contact performance of the contacts between the wiring line 111 and the auxiliary wiring line 106 is favorable because it reduces the entire electric resistance. Where the auxiliary wiring line 106 includes aluminum, to obtain superior contact performance it is effective to form the wiring line 111 as a laminate structure consisting of a titanium film and an aluminum film formed thereon.

In FIG. 1B, reference numeral 113 denotes a wiring line that lies below and crosses the wiring line 111 (also see FIG. 1C). For example, in the case of the peripheral circuits integration type liquid crystal display device, this type of structure is employed for a clock signal line of a peripheral circuit and for those gate lines of TFTs of the peripheral circuit which are connected to the clock signal line.

Where the wiring line 113 that crosses the wiring line 111 is disposed in the same layer as the auxiliary wiring line 106 for reducing the electric resistance, the auxiliary wiring line 106 may be divided by eliminating its portion corresponding to the wiring line 113 and its vicinities. The wiring line 113 may be disposed between the divided parts (see FIG. 1C). With this structure, the electric resistance is sufficiently reduced and the formation of the auxiliary wiring line 106 does not alter the manufacturing process (the manufacturing process remains the same as the conventional one).

The above-described structure of the invention can greatly reduce the electric resistance of wiring lines. Further, since the area necessary for wiring and the width of the wiring lines can be made the same as in the conventional case, the capacitance between adjacent wiring lines remains almost the same as in the conventional case. In the peripheral circuits integration type liquid crystal display device, the capacitance between the wiring lines and the opposed electrode does not increase.

As a result, the waveform rounding can be reduced effectively in wiring lines having a length of more than 1 cm, even preferably more than 3 cm (the upper limit depends on the panel size) to which a high-frequency signal of several megahertz, for instance, more than 1 MHz, is applied. In a circuit constituted of TFTs, this results in advantages that the circuit can be prevented from operating erroneously, the margin in operation timing can be reduced, and signals can be transmitted correctly.

Auxiliary wiring lines can be formed only by changing a mask pattern in a conventional process of forming scanning lines (gate lines) and data lines (source lines). That is, the resistance of wiring lines can be reduced without increasing the number of steps.

In a semiconductor device having the wiring structure of the invention, the TFT may be of either the top-gate type or the bottom-gate type.

If the wiring structure of the invention is employed for all wiring lines in a peripheral circuit, there may occur a case that short-circuiting is caused at a location where wiring lines are arranged finely in grid-like form.

However, the effect of reducing the electric resistance can be attained even if the wiring structure of the invention is applied to the part of wiring lines that are supplied with a high frequency signal. Therefore, auxiliary wiring lines may be provided in parallel with the respective wiring lines only at necessary locations rather than for all the wiring lines.

In this case, it is important that wiring lines to which high-frequency signals of the same kind (for instance, a clock signal and its inverted signal, divided clock signals, and divided video signals) are applied have approximately equal resistance values. This allows the wiring lines to transmit signals with similar degrees of waveform rounding.

Another configuration is possible in which auxiliary wiring lines are provided for only the peripheral wiring lines 907 (see FIG. 5) over their entire length and no wiring lines are provided for the wiring lines 908 and 909 of the peripheral circuits 903 and 904. The peripheral wiring lines 907 do not have any wiring lines that cross themselves over their entire length (i.e., to the connecting points to the peripheral circuit 903 or 904), and hence it is not necessary to divide the associated auxiliary wiring lines. Therefore, the electric resistance can be reduced more effectively than in a case where auxiliary lines are provided for the other wiring lines.

It goes without saying that the electric resistance may further be reduced by providing, when necessary, a layer in which to form only auxiliary wiring lines, though in this case the auxiliary wiring lines are formed in the layer and in a step different than the other wiring lines such as scanning lines and data lines are formed and hence the number of steps increases.

In the invention, a wiring line and an auxiliary wiring line may be formed in any layers as long as they are provided with an interlayer insulating film interposed in between.

It is preferable that the width of an auxiliary wiring line be (approximately) equal to or smaller than that of the associated wiring line, because this structure prevents an increase in the capacitance that is formed with the opposed electrode which increase would otherwise be caused by the existence of the auxiliary wiring line.

Embodiment 1

This embodiment is directed to a case in which wiring lines having a structure for reducing the electric resistance [is] *are* formed at the same time, i.e., in the same step, as TFTs capable of being driven at a high frequency are formed on a substrate having an insulating surface, and in which a circuit-side substrate of an active matrix liquid crystal display device is formed.

FIGS. 2A to 2D, 3A to 3E and 4A to 4C are sectional views showing a manufacturing process according to this embodiment. In each drawing, the left-hand portion shows a wiring section where wiring lines having the structure for reducing the electric resistance are to be formed, the central portion shows a peripheral circuit section where complementary TFTs to constitute a peripheral circuit are to be formed, and the right-hand portion shows a pixel section where TFTs to constitute an active matrix circuit are to be formed.

In a liquid crystal display device that is manufactured by using a panel that is formed according to this embodiment, the pixel section including the active matrix circuit has a VGA configuration (640 (×3 (colors))×480 pixels) of 10 cm in horizontal length.

Figure 5:
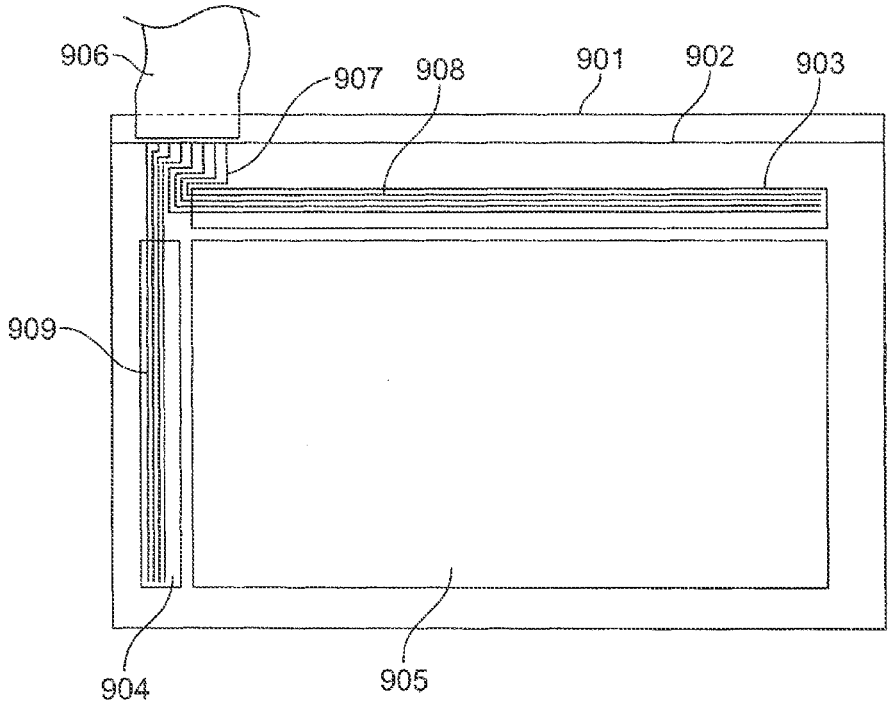
FIG. 5 (Prior Art)
FIG. 5 is a top view of a peripheral circuits integration type active matrix liquid crystal display device.

In this embodiment, the wiring lines having the structure for reducing the electric resistance are clock signal lines in the peripheral circuit (i.e., lines for transmitting input clock signals to the entire peripheral circuit; correspond to the wiring lines 908 shown in FIG. 5). Naturally the structure of the invention may be applied to other wiring lines to which a high frequency signal is applied, for instance, video signal lines.

The structure of the invention may be applied to all wiring lines in the peripheral circuit. However, in this case, if wiring lines that cross the wiring lines to which the auxiliary lines are connected are provided in the layer in which the auxiliary lines are formed, there exist a number of locations where the auxiliary wiring lines are divided. As a result, the effect of reducing the electric resistance of the wiring lines may become insufficient or the degree of signal rounding may vary from one wiring line to another, to cause various inconveniences. Care should be taken to avoid such events.

First, a 3,000-Å-thick silicon oxide film as an undercoat film 202 is formed on a quartz substrate 201. The undercoat film 202 may be omitted if the surface of the quartz substrate 201 is good in smoothness and cleaning is performed sufficiently. Although the use of a quartz substrate is preferable according to the current technologies, the invention is not limited to such a case and other substrates that withstand temperatures of heating treatments can also be used.

A 500-Å-thick amorphous silicon film 203 as a starting film for formation of a crystalline silicon film is then formed by low-pressure thermal CVD.

Thereafter, a 1,500-Å-thick silicon oxide film (not shown) is formed and then patterned into a mask 204. The mask [205] *204* has openings 205, where the amorphous silicon film 203 is exposed.

Each opening 205 has a long and narrow rectangular shape whose longitudinal direction is perpendicular to the paper surface of the drawings. It is proper that the width of the openings [203] *205* be 20 μm or [longer] *wider*. The length in the longitudinal direction may be set at a necessary value.

Then, to introduce nickel as a metal element for accelerating crystallization, a nickel acetate solution containing the nickel element at 10 ppm (in terms of weight) is applied and an unnecessary part of the solution is removed by performing spin drying with a spinner. The amount of the nickel element to be introduced can be controlled by the content (density) of the nickel element in the solution.

The metal element for accelerating crystallization may be one or a plurality of elements selected from Ni, Fe, Co, Ru, Rb, Pd, Os, Ir, Pt, Cu, and Au.

The nickel element thus comes to exist in a state as indicated by a broken line 206 in FIG. 2A. In this state, the nickel element is held at the bottom portion of the opening 205 in contact with the selected parts of the amorphous silicon film 203.

Alternatively, the nickel element may be introduced by ion implantation. In this case, the introduction positions of the nickel element can be controlled more accurately than in the case of applying a solution of the nickel element. Therefore, this method is particularly effective when the nickel element introduction region is as very narrow as several micrometers or less or it is complex in shape.

A heat treatment is then performed at 600° C. for 8 hours in a nitrogen atmosphere containing hydrogen at 3% in which the oxygen content is minimized (or in a simple nitrogen atmosphere). As a result, crystal growth proceeds parallel with the substrate 201, i.e., in directions 207 shown in FIG. 2B. This crystal growth proceeds outward from the regions of the openings 205 where the nickel element was introduced. This type of crystal growth parallel with the substrate is called lateral growth.

The surface of a crystalline silicon film obtained by the lateral crystal growth is much smoother than a conventional low-temperature polysilicon and high-temperature polysilicon. This is considered due to the fact that grain boundaries extend approximately in the same direction.

A usual polycrystalline silicon film and a silicon film called a polysilicon film has surface asperity of more than ±100 Å. In contrast, it was observed that the surface asperity of a crystalline silicon film obtained by the lateral growth as performed in this embodiment was less than ±30 Å. The asperity should be minimized because it deteriorates the interface characteristics with a gate insulating film.

Under the above-mentioned heat treatment conditions for crystallization, the lateral growth can proceed over more than 100 μm. In this manner, a silicon film 208 having laterally grown regions is obtained.

The heat treatment for crystal growth may be performed at 450° to 1,100° C. (the upper limit is restricted by the heat resistance of the substrate 201). To secure a certain lateral growth length, it is preferable that the heat treatment temperature be set at 500° C. or more. However, even if the temperature is further increased, a resulting increase in crystal growth length and improvement in crystallinity are not remarkable. Therefore, in view of economy and simplification of the process, it is sufficient that the heat treatment be performed at 590° C. to 630° C., for instance, about 600° C.

The silicon oxide film mask 204 for the selective introduction of the nickel element is then removed.

In this state, the nickel element is unevenly distributed in the film 208. In particular, the nickel element exists at relatively high concentrations at the leading portions of the crystal growth indicated by numeral 207 and the portions where the openings 205 have existed before the mask 204 is removed.

Therefore, it is important to avoid those portions in forming active layers, that is, to form active layers so that they do not include the regions where the nickel element exists at high concentrations.

Laser light illumination may be performed after the crystallization to improve the crystallinity. The laser light illumination has an effect of decomposing lumps of the nickel element that exist in the film 208, thereby facilitating removal of the nickel element. The laser light illumination at this stage does not cause additional lateral growth.

The laser light used may be excimer laser light in the ultraviolet wavelength range. For example, a KrF excimer laser (wavelength: 248 nm) and a XeCl excimer laser (wavelength: 308 nm) can be used.

A heat treatment is then performed at 950° C. in an oxygen atmosphere containing a halogen element, for instance, an oxygen atmosphere containing HCl at 3 volume percent, to form a 200-Å-thick thermal oxidation film 209. As a result of the formation of the thermal oxidation film 209, the thickness of the silicon film 208 decreases by about 100 Å; the thickness of the silicon film 208 becomes about 400 Å (see FIG. 2C).

In general, when a thermal oxidation film is formed on the surface of a silicon film, the thickness of a surface rise portion is approximately equal to the distance of inward oxidation. For example, when 100-Å-thick thermal oxidation film is formed on the surface of a 100-Å-thick silicon film, the thickness of the silicon film is reduced by 50 Å, to provide a 50-Å-thick silicon film and a 100-Å-thick thermal oxidation film formed on its surface.

In the above step, silicon elements having unstable bonding states in the film 208 are used for the formation of the thermal oxidation film 209, whereby defects in the film 208 are reduced in number and the crystallinity is improved.

At the same time as the formation of the thermal oxidation film 209, the nickel element is gettered through the action of the halogen element that is chlorine in this embodiment.

Naturally the nickel element is captured by the thermal oxidation film 209 so as to exist therein at a relatively high concentration, and hence the concentration of the nickel element in the silicon film 208 is reduced accordingly. The state of FIG. 2C is thus obtained.

The thermal oxidation film 209 thus formed is then removed. In this manner, the crystalline silicon film 208 that has been reduced in the content of the nickel element is obtained.

The crystalline silicon film 208 thus obtained has a structure in which the crystal structure extends in one direction that coincides with the crystal growth direction, i.e., a structure in which a plurality of long and narrow, cylindrical crystal bodies are arranged parallel with each other with a plurality of grain boundaries extending in one direction interposed in between.

Thereafter, island-like regions 210 to 212 that are lateral growth regions are formed by patterning. The island-like regions 210 to 212 will become active layers of TFTs.

In the above step, the pattern layout is performed in such a manner that the direction connecting the source region and the drain region coincides or approximately coincides with the crystal growth direction. As a result, the carrier movement direction is made coincident with the direction in which crystal lattices are continuous, whereby high performance TFTs can be obtained.

A 1,000-Å-thick silicon oxide film 213 is then formed by plasma CVD (see FIG. 2D).

Subsequently, 300-Å-thick thermal oxidation films 301 to 303 are formed by performing a heat treatment at 950° C. in an oxygen atmosphere containing HCl at 0.1 to 10 volume percent, for instance, 3 volume percent (see FIG. 3A). As a result of the formation of the thermal oxidation films 301 to so 303, the thickness of the patterns 210 to 212 (which will become active layers) is reduced to 250 Å.

The above step provides the same effect as the step in which the thermal oxidation film 209 was formed. The thermal oxidation films 301 to 303 will serve as parts of gate insulating films of the TFTs.

In this embodiment, the thickness (250 Å) of the finally obtained crystalline silicon films, i.e., the active layers 210 to 212 is smaller than the thickness (300 Å) of the second thermal oxidation films 301 to 303. This provides the effect that is caused by the formation of the thermal oxidation films and is necessary for obtaining the unique crystal structure.

In the TFTs of this embodiment, the final thickness of the crystalline silicon films that constitute the active layers 210 to 212 is preferably 100 to 750 Å and even preferably 150 to 450 Å. With this thickness, the unique crystal structure in which the crystallinity is held continuously in one direction can be obtained in more remarkable form with high reproducibility.

According to the current technologies, the concentration, as measured by utilizing the SIMS (secondary ion mass spectroscopy), of nickel elements finally remaining in the above-formed crystalline silicon films as the active layers 210 to 212 is $1\times10^{14}$ to $5\times10^{17}$ atoms/cm$^3$. It is preferable that the concentration be as low as possible.

Naturally it is possible to further reduce the concentration of nickel elements remaining in the crystalline silicon films by reviewing the entire manufacturing process, thoroughly performing the cleaning step, and thoroughly increasing the cleanliness of the apparatuses used.

Further, since nickel elements move in the thermal oxidation film in the step of forming it, the nickel element concentration comes to have a gradient or a distribution in the thickness direction of the resulting crystalline silicon film.

In general, there is a tendency that the concentration of the metal element increases toward the interface of the thermal oxidation film. Under certain conditions, there may occur a tendency that the concentration of the metal element increases toward the substrate or the undercoat film, i.e., toward the back-side interface (whether this tendency occurs strongly depends on the film quality of an amorphous silicon film as a starting film).

Where a halogen element is contained in the atmosphere in forming the thermal oxidation film, the halogen element comes to have a concentration profile similar to that of the metal element; the concentration increases toward the front surface of the crystalline silicon film and/or its back surface (the difference in concentration profile also depends on the film quality of a starting film).

Thereafter, a 4,000-Å-thick aluminum film for formation of gate electrodes and an auxiliary wiring line is formed by sputtering. Scandium is caused to be contained in the aluminum film at 0.2 wt %.

The reason for causing scandium to be contained in the aluminum film is to suppress occurrence of hillocks and whiskers in later steps. Hillocks and whiskers are needle-like or prickle-like protrusions that may occur during a heat treatment due to abnormal growth of aluminum.

Examples of the material of the gate electrodes, other than aluminum, are tantalum (Ta), polycrystalline silicon heavily doped with phosphorus (P), and tungsten silicide (WSi). Further, polycrystalline silicon doped with phosphorus and tungsten silicide may be used to form a laminate structure or a mixed structure.

A 500-Å-thick silicon nitride film is then formed. Subsequently, patterning is performed by using resist masks 308 to 311, to form aluminum patterns 304 to 307 and silicon nitride films 351 to 354 (see FIG. 3B).

In the state that the resist masks 308 to 311 are left, anodization is performed by using a 3%-aqueous solution of oxalic acid as an electrolyte and using the aluminum patterns 304 to 307 as anodes. As a result, porous anodic oxide films 316 to 319 are formed.

In this step, since the resist masks 308 to 311 and the silicon nitride films 351 to 354 exist above the aluminum patterns 304 to 307, the anodic oxide films 316 to 319 are formed selectively, i.e., only on the side faces of the aluminum patterns 304 to 307.

The anodic oxide films 316 to 319 can be grown until their thickness reaches several micrometers. In this embodiment, their thickness is set at 6,000 Å. The growth length can be controlled by the anodization time.

Thereafter, dense anodic oxide films are formed by performing anodization in an ethylene glycol solution containing tartaric acid at 3%.

In this step, since the electrolyte enters the porous anodic oxide films 316 to 319 and the silicon nitride films 351 to 354 [exists] *exist* above the aluminum patterns, dense anodic oxide films 320 to 323 are formed selectively, i.e., only on the side faces of the aluminum patterns.

The thickness of the dense anodic oxide films 320 to 323 is set at 1,000 Å by properly controlling the [application] *applied* voltage.

After the formation of the anodic oxide films 320 to 323, the resist masks 308 to 311 are removed.

Then, the exposed parts of the silicon oxide film 213 as well as the parts of the thermal oxidation films 301 to 303 are etched by dry etching. The state of FIG. 3C is thus obtained.

The porous anodic oxide films 316 to 319 are then removed by using a mixed acid of acetic acid, nitric acid, and phosphoric acid. Further, the silicon nitride films 351 to 354 are removed to obtain the state of FIG. 3D.

Figures 3A, 3B, 3C, 3D, 3E:
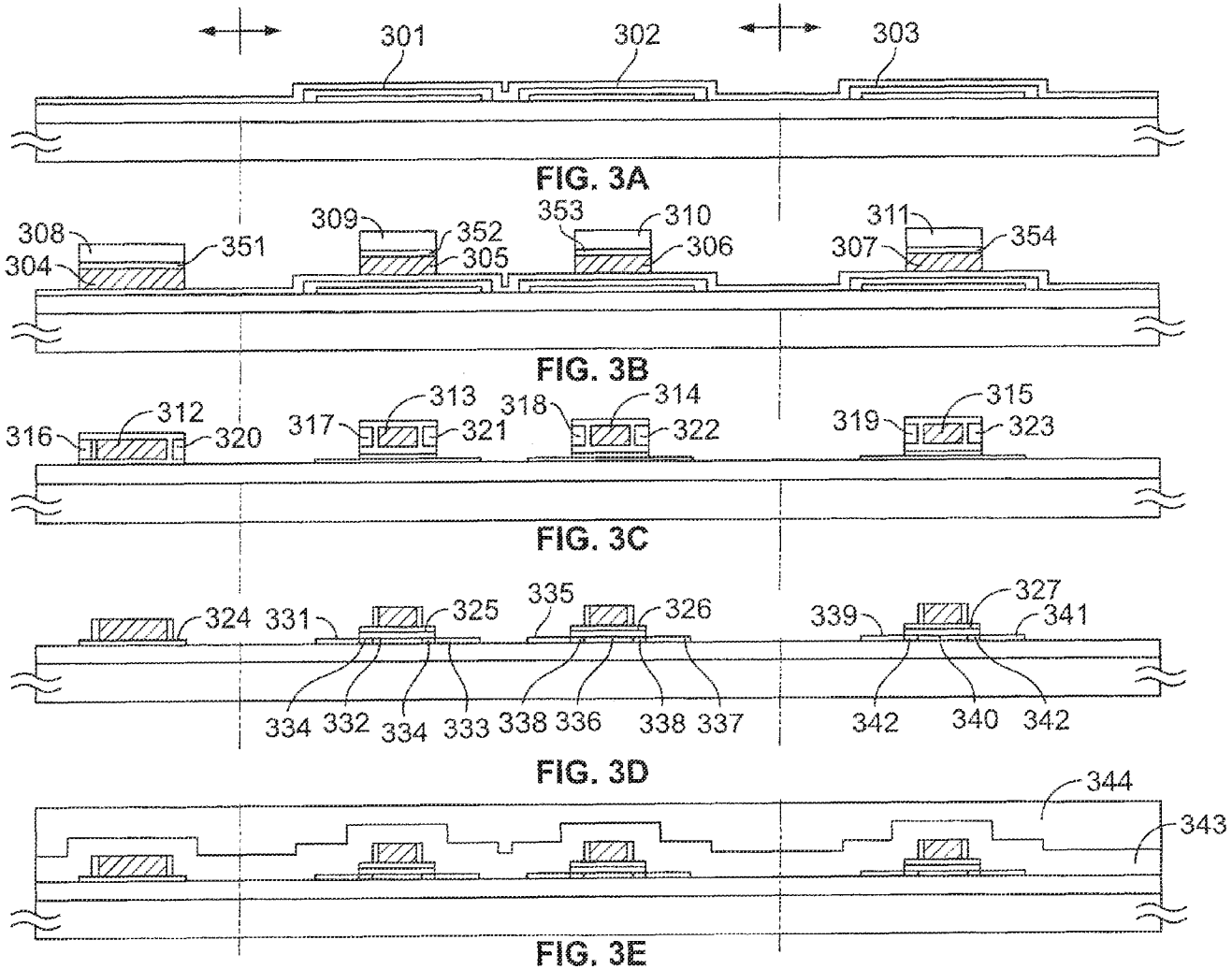

In this embodiment, as shown in FIG. 3D, an auxiliary wiring line 312 is formed at the same time and in the same step as gate electrodes 313 to 315. Therefore, the auxiliary wiring line 312 can be formed in the same step as the conventional step by altering only the mask pattern.

In this embodiment, the dense anodic oxide films 320 are formed on the side faces of the auxiliary wiring line 312 and part of the silicon oxide film 213 remains under the auxiliary wiring line 312.

After the state of FIG. 3D is obtained, impurity ions are implanted. In this embodiment, by alternately forming resist masks, P (phosphorus) ions are implanted by plasma doping into the left-hand TFT in the peripheral circuit section and the TFT in the pixel section and B (boron) ions are implanted by plasma doping into the right-hand TFT in the peripheral circuit section.

As a result of this step, heavily doped regions 331, 333, 335, 337, 339, and 341 and lightly doped regions 334, 338, and 342 are formed, because the residual silicon oxide films 325, 326, and 327 serving as a semi-transparent masks interrupt part of ions being implanted.

Then, the regions doped with impurity ions are activated by illuminating those with laser light (or strong light from a lamp). In the above manner, source regions 331, 335, and 339, channel forming regions 332, 336, and 340, drain regions 333, 337, and 341, and low-concentration impurity regions 334, 338, and 342 are formed in a self-aligned manner.

The regions 334, 338, and 342 are LDD (lightly doped drain) regions (see FIG. 3D).

Where the dense anodic oxide films 321 to 323 are made as [thick-as] *thick as* 2,000 Å or more, offset gate regions can be formed outside the channel forming regions 332, 336, and 340 at a length equal to the thickness of the dense anodic oxide films 321 to 323.

Although offset gate regions are formed also in this embodiment, they are not shown in the drawings because they are so short that they have only small contribution and the drawings would be too complex if they were shown.

To form the dense anodic oxide films 321 to 323 as thick as [1,000] *2,000* Å or more, the [application] *applied* voltage needs to be 200 V or more. Therefore, care should be taken of reproducibility and safety.

Thereafter, a 2,000-Å-thick silicon nitride film 343 as one of first interlayer insulating films is formed by plasma CVD. Instead of a silicon nitride film, a silicon oxide film or a laminate film of a silicon nitride film and a silicon oxide film may be used.

An organic resin film 344 is formed on the silicon nitride film 343 by spin coating (see FIG. 3E). Examples of the organic resin material are polyimide, polyamide, polyimide-amide, and acrylic.

Then, contact holes are formed through the first interlayer insulating films 343 and 344. Subsequently, a 3,000-Å-thick titanium/aluminum/titanium laminate film is formed and then patterned into source electrodes 402 and 407, drain electrodes

406 and 409, a source/drain electrode 404, gate lead-out lines 403 and 405, and a wiring line 401.

The wiring line 401 is electrically connected in parallel to the auxiliary wiring line 312 via a plurality of contact holes that are arranged in the longitudinal direction of the wiring line 401. Because of the parallel connection to the auxiliary wiring line 312, the electric resistance is reduced considerably, whereby the waveform rounding of a transmitted high-frequency signal can be reduced greatly.

Where a gate line (extends to the gate electrode of a TFT) that is formed in the same layer as the auxiliary wiring line 312 goes under and crosses the wiring line 401, the auxiliary line 312 is divided so as to be separated from the gate line by 40 μm (in the manner as shown in FIG. 1B).

Part of the drain electrode 409 is used as an electrode for forming an auxiliary capacitor.

Figure 4A:
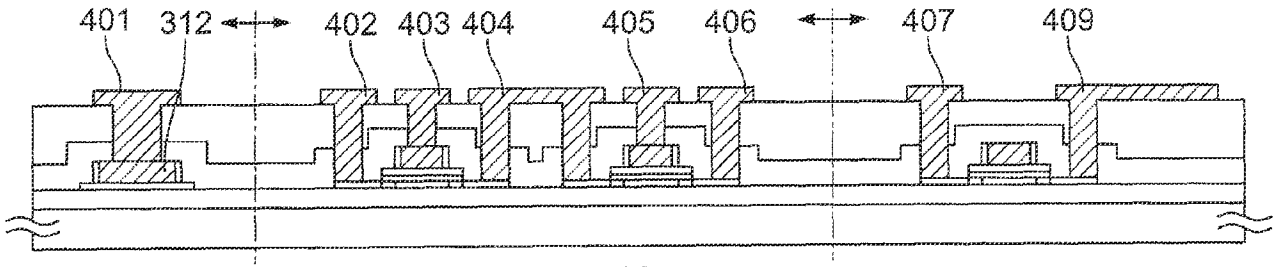

The TFTs and the wiring line with reduced electric resistance are thus completed as shown in FIG. 4A.

Although the gate lead-out lines 403 and 405 are drawn as if they were formed in the same cross-section as source electrodes and the drain electrodes, actually the gate lead-out lines 403 and 405 are connected to portions that extend from the gate electrodes 313 and 314.

Figure 4B:
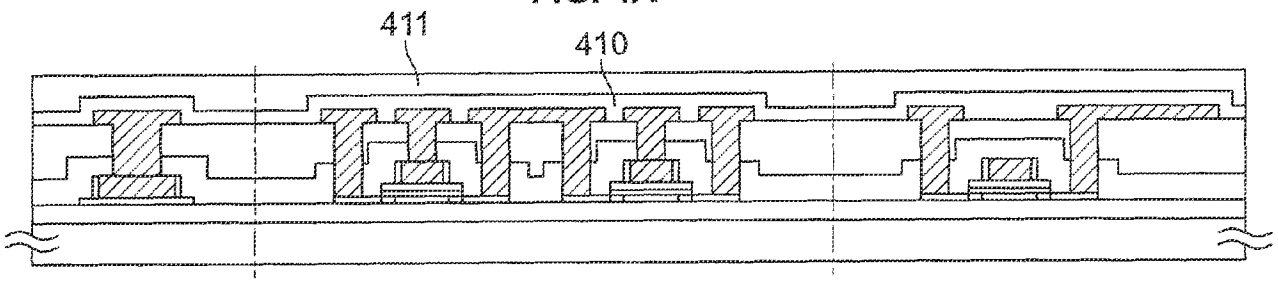
Figure 4C:
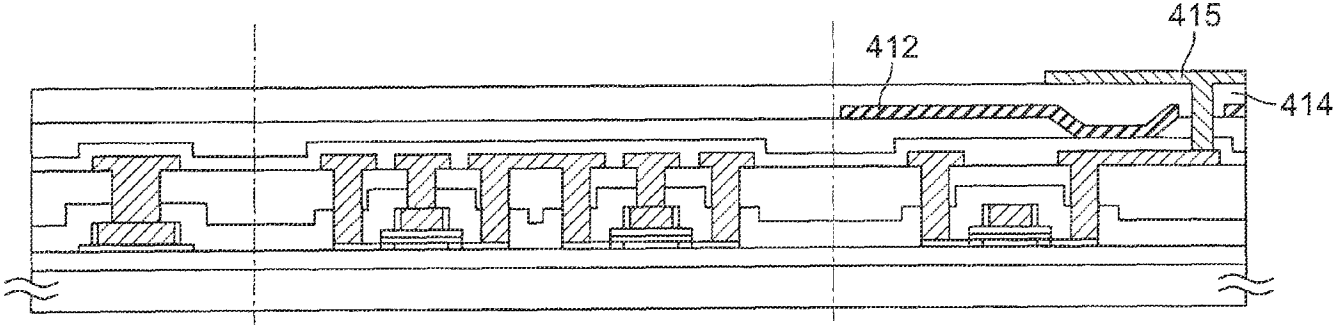

Then, a 1,000-Å-thick silicon nitride film 410 as a second interlayer insulating film by plasma CVD. Further, an organic resin film 411 is formed by spin coating. Examples of the organic resin material, in addition to polyimide, are polyamide, polyimideamide, and acrylic. The state of FIG. 4B is thus obtained.

Then, an opening is formed in the organic resin film 411 and a laminate film of a titanium film and an aluminum film is formed as a black matrix (BM) 412. The black matrix 412 has not only the original function as a light shield film but also a function as an electrode for forming an auxiliary capacitor with the silicon nitride film 410 and the drain electrode 409.

After the formation of the black matrix 412, an organic resin film 414 as a third interlayer insulating film is formed. Then, after a contact hole for the drain electrode 409 is formed, an ITO (indium tin oxide) pixel electrode 415 is formed.

In the above manner, the circuit-side substrate of the active matrix liquid crystal display device is formed. Thereafter, the top surface of the circuit-side substrate is subjected to an alignment layer treatment and then opposed to an opposed substrate that has also been subjected to an alignment layer treatment, to form a panel. A liquid crystal material is injected into the panel and then sealed to complete the device.

The TFTs according to this embodiment exhibit much superior characteristics that were not obtained conventionally.

For example, NTFTs (n-channel TFTs) exhibit superior performance such as mobility of 200 to 300 $cm^2/Vs$ and S-values of 75 to 90 mV/dec ($V_D$=1 V), and PTFTs (p-channel TFTs) exhibit superior performance such as mobility of 120 to 180 $cm^2/Vs$ and [S-vales] *S-values* of 75 to 100 mV/dec ($V_D$=1 V).

In particular, the [S-value] *S-values* of TFTs according to this embodiment [is] *are* surprisingly small, that is, ½ or less than the S-values of conventional high-temperature polysilicon TFTs and low-temperature polysilicon TFTs.

The TFTs according to this embodiment can operate at a very high drive frequency such as tens to hundreds of megahertz. For example, when the drive signal voltage is 3.3 to 5 V, operation at 1 GHz is possible on the ring oscillator level and operation at 100 MHz is possible on the shift register level.

The TFT using a crystalline silicon film having the above-described unique crystal structure has a feature that by virtue of the crystal structure the short channel effect does not easily occur, as well as a feature of being suitable for high-speed operation because it is free of a problem of capacitance via the substrate that is an insulator.

A scaling rule applies to conventional MOS transistors that use a single crystal silicon wafer. The scaling rule means that if the dimensions of the transistor are reduced according to prescribed rules, the performance of the transistor is improved according to prescribed rules.

However, in recent years when the miniaturization has made a great advance, it is difficult to improve the performance of the transistor according to the scaling rule.

For example, as the channel length is made shorter, to suppress the short channel effect it becomes more necessary to make a close improvement such as implanting an impurity in a region adjacent to the channel, which makes the manufacturing process more difficult.

In contrast, when a crystalline silicon film having the above-described unique crystal structure is used, necessary characteristics can be obtained with dimensions that do not conform to the scaling rule.

This is considered due to the following factors:

(1) The short channel effect is suppressed by making the extending direction of columnar crystal bodies coincide with the carrier movement direction in the channel.

(2) The capacitance problem becomes far less serious by using an insulator as a substrate.

(3) The use of aluminum for the gate electrode is advantageous for high-speed operation.

Item (1) will be explained as follows. Each columnar crystal structural body is sectioned by an inactive grain boundary. Since the energy level is high in the grain boundary portion, the carrier movement is restricted to the crystal bodies extending direction. According to the same principle, depletion layers are prevented from expanding from the source and drain regions to the channel inside. It is considered that these phenomena suppress the short channel effect.

Specific examples of phenomena that do not conform to the scaling rule are as follows.

Where according to the scaling rule the thickness of a gate insulating film should be, say, 100 Å, if a crystalline silicon film according to the invention is used the same characteristics can be obtained even with a gate insulating film of 300 Å in thickness. This results in improved resistance to static electricity. This is considered due to the above-described factors (1) to (3).

As for the channel length, as in the case of the thickness of a gate insulating film, a given characteristic can be obtained with a one-rank relaxed condition as compared to the case where the scaling rule applies. This is advantageous in manufacturing a semiconductor circuit capable of high-speed operation over a wide area at a low cost.

In this embodiment, the long wiring line 401 to which a high-frequency signal is to be applied is electrically connected in parallel to the auxiliary wiring line 312 via the interlayer insulating film. As a result, the electric resistance of the wiring line 401 is greatly reduced whereby waveform rounding of a transmitted signal can be reduced considerably.

Specifically, when a clock signal of 12.5 MHz in frequency was applied to a clock signal line that is as extremely long as about 10 cm that is provided in a signal lines driving peripheral circuit, no erroneous operation occurred and good display performance was attained.

Embodiment 2

This embodiment is directed to a case in which the structure of the wiring line 401 and the auxiliary wiring line 312 according to the first embodiment is applied to peripheral wiring lines (corresponds to the peripheral wiring lines 907 in FIG. 5) that is connected to a signal lines driving peripheral circuit.

That is, for a peripheral wiring line that is conventionally formed on only the first interlayer insulating layer, an auxiliary wiring line is formed under and along the peripheral wiring line in the same layer as the gate electrodes of the [TFTS] *TFTs*.

The peripheral wiring line and the auxiliary wiring line are connected to each other in parallel via a plurality of contact holes that are arranged in the longitudinal direction of the peripheral wiring line.

Since the peripheral wiring line does not have any wiring line that exists in a layer above or below the layer of the peripheral wiring line and crosses the peripheral wiring line, the auxiliary wiring line can be connected in parallel to the peripheral wiring line over its entire length without being divided. Therefore, the effect of reducing the electric resistance is very large. Even if the auxiliary wiring lines are provided only for the peripheral wiring lines and the peripheral circuits are left in the conventional state of the one-layer structure (no auxiliary lines are formed), waveform rounding of a high-frequency signal on the wiring lines can greatly be reduced from the conventional case.

Embodiment 3

This embodiment is directed to a case in which wiring lines are provided for both of the signal lines (source lines) and the scanning lines (gate lines) in the active matrix circuit as the display section in the configuration of the first embodiment, to thereby reduce the electric resistance of those wiring lines.

The gate lines are extended portions of the gate electrodes 315 of the TFTs of the pixel section and the source lines are extended portions of the source electrodes 407 of the TFTs [if] *of* the pixel section.

In this embodiment, an auxiliary wiring line for the gate line under the silicon nitride film 343 is formed above the organic resin film 344 in the same line as the source line and the source electrode 407, and is connected in parallel to the gate line via a plurality of contact holes that are arranged along the gate line. The auxiliary wiring line for the gate line is formed so as to be separated from the source line in the same layer.

On the other hand, a wiring line for the source line above the organic resin film 344 is formed in the same layer as the gate line and the gate electrode 315 under the silicon nitride film 343, and is connected in parallel to the source line via a plurality of contact holes that are arranged along the source line. The auxiliary wiring line for the source line is formed so as to be separated from the gate line in the same layer.

It is preferable that a gap of tens of micrometers or more be provided in the dividing portion of the auxiliary wiring line for each of the source line and the gate line.

With the above structure, the electric resistance of the wiring lines that constitute the active matrix circuit can greatly be reduced. As a result, good display performance can be attained even if the display area is increased. Further, the manufacturing process is not changed from the conventional one and only the mask pattern needs to be altered.

Embodiment 4

In this embodiment, the structure of the first to third embodiments are used in a configuration that employs inverted staggered structure TFTs. The same effects can be obtained even if inverted staggered structure TFTs are used in place of the planar TFTs in each of the first to third embodiments.

Using a highly heat resistant material such as polycrystalline silicon heavily doped with phosphorus as the gate electrode of an inverted staggered structure TFT is effective in obtaining high-performance TFT.

According to the invention, in an integrated circuit using TFTs, particularly in a peripheral circuits integration type liquid crystal display device, waveform rounding of a high-frequency (tens of megahertz or more) signal on wiring lines can greatly be reduced. Further, the structure of the invention can be obtained without increasing the number of manufacturing steps from the conventional case.

The structure of a semiconductor device according to the invention can be applied to any wiring [lines] *line* in an integrated circuit that is formed, by using TFTs, on a substrate having a large area, for instance, a several centimeter square. The invention can prevent rounding or deterioration of a signal waveform, and can improve the operation speed as well as the image quality in a device that performs image display.

The invention can be used not only in peripheral circuits that are formed on the same substrate as an active matrix circuit of a transmission or reflection type active matrix liquid crystal display device, but also in display devices using EL (electroluminescence) element and other various circuits using TFTs.

What is claimed is:

1. An active matrix type display device comprising:

a substrate having an insulating surface;

a plurality of pixel electrodes formed over said substrate[:] *with* at least one [thin film transistor] *pixel electrode of said plurality of pixel electrodes being* electrically connected to [said pixel electrodes, respectively] *at least one thin film transistor*; *and* a driving circuit formed over the substrate for driving said at least one thin film transistor, said driving circuit comprising:

a first wiring formed over said substrate*, wherein said first wiring is formed on a same layer as at least one of a source and a drain electrode of said at least one thin film transistor*;

an interlayer insulating film formed over said first wiring; and a second wiring formed [on] *over* said interlayer insulating film, wherein said second wiring extends in parallel with said first wiring and *is* electrically connected to said first wiring via a plurality of contact holes opened in said interlayer insulating film.

[2. The active matrix device according to claim 1 wherein said thin film transistor has a channel region comprising crystalline silicon.]

3. The active matrix type display device according to claim 1 wherein said display device is a liquid crystal display device.

4. The active matrix type display device according to claim 1 wherein said display device is an electroluminescence display device.

5. The active matrix type display device according to claim 1 wherein said first wiring comprises [at least one selected from the group consisting of aluminum, tantalum, polycrystalline silicon, and tungsten silicide] *a laminate structure of titanium and aluminum*.

[6. The active matrix type display device according to claim 1 wherein said second wiring comprises aluminum.]

[7. The active matrix type display device according to claim 1 wherein said first wiring is formed on a same layer as a gate electrode of said at least one thin film transistor.]

[8. The active matrix type display device according to claim 1 wherein said second wiring is formed on a same layer as at least one of a source and a drain electrode of said at least one thin film transistor.]

9. An active matrix type display device comprising:

a substrate having an insulating surface;

a plurality of pixel electrodes formed over said substrate[;] *with* at least one [thin film transistor] *pixel electrode of said plurality of pixel electrodes being* electrically connected to [said pixel electrodes, respectively] *at least one thin film transistor*;

a first wiring formed over said substrate, *wherein said first wiring is formed on a same layer as at least one of a source and a drain electrode of said at least one thin film transistor*;

an interlayer insulating film comprising an organic resin formed over said first wiring; and a second wiring formed [on] *over* said interlayer insulating film, wherein said second wiring extends in parallel with said first wiring and *is* electrically connected to said first wiring via a plurality of contact holes opened in said interlayer insulating film.

10. The active matrix device according to claim [7] *9* wherein said thin film transistor has a channel region comprising crystalline silicon.

11. The active matrix device according to claim 9 wherein said organic resin is [s elected] *selected* from the group consisting of polyimide, polyamide, polyimideamide and acrylic.

12. The active matrix type display device according to claim 9 wherein said display device is a liquid crystal display device.

13. The active matrix type display device according to claim 9 wherein said display device is an electroluminescence display device.

14. The active matrix type display device according to claim 9 wherein said first wiring comprises [at least one selected from the group consisting of aluminum, tantalum, polycrystalline silicon, and tungsten silicide] *a laminate structure of titanium and aluminum*.

[15. The active matrix type display device according to claim 9 wherein said second wiring comprises aluminum.]

[16. The active matrix type display device according to claim 9 wherein said first wiring is formed on a same layer as a gate electrode of said at least one thin film transistor.]

[17. The active matrix type display device according to claim 9 wherein said second wiring is formed on a same layer as at least one of a source and a drain electrode of said at least one thin film transistor.]

18. An active matrix type display device comprising:

a substrate having an insulating surface;

a plurality of pixel electrodes formed over said substrate[;] *with* at least one [thin film transistor] *pixel electrode of said plurality of pixel electrodes being* electrically connected to [said pixel electrodes, respectively] *at least one thin film transistor*; *and* at least one wiring formed over said substrate and connected to an external circuit;

wherein said wiring comprises a first line *formed on a same layer as at least one of a source and a drain electrode of said at least one thin film transistor*, and a second line formed over the first line with an insulating film interposed therebetween, said second line extending in parallel with and electrically connected to said first line through a plurality of contact holes opened in said insulating film.

19. The active matrix device according to claim 18 wherein said thin film transistor has a channel region comprising crystalline silicon.

20. The active matrix type display device according to claim 18 wherein said display device is a liquid crystal display device.

21. The active matrix type display device according to claim 18 wherein said display device is an electroluminescence display device.

22. The active matrix type display device according to claim 18 wherein said first line comprises [at least one selected from the group consisting of aluminum, tantalum, polycrystalline silicon, and tungsten silicide] *a laminate structure of titanium and aluminum*.

[23. The active matrix type display device according to claim 18 wherein said second line comprises aluminum.]

[24. The active matrix type display device according to claim 18 wherein said first line is formed on a same layer as a gate electrode of said at least one thin film transistor.]

[25. The active matrix type display device according to claim 18 wherein said second line is formed on a same layer as at least one of a source and a drain electrode of said at least one thin film transistor.]

[26. An active matrix type display device comprising:

a substrate having an insulating surface;

a plurality of pixel electrodes formed over said substrate;

at least one thin film transistor electrically connected to said pixel electrodes, respectively;

at least one wiring formed over said substrate and connected to an external circuit, said wiring comprising a first line and a second line formed over the first line with an insulating film interposed therebetween, wherein said second line extends in parallel with and is electrically connected to said first line through a plurality of contact holes opened in said insulating film, wherein said first line is formed on a same layer as a gate electrode of said thin film transistor is formed.]

[27. The active matrix device according to claim 26 wherein said thin film transistor has a channel region comprising crystalline silicon.]

[28. The active matrix type display device according to claim 26 wherein said display device is a liquid crystal display device.]

[29. The active matrix type display device according to claim 26 wherein said display device is an electroluminescence display device.]

[30. The active matrix type display device according to claim 26 wherein said first line comprises at least one selected from the group consisting of aluminum, tantalum, polycrystalline silicon, and tungsten silicide.]

[31. The active matrix type display device according to claim 26 wherein said second line comprises aluminum.]

[32. The active matrix type display device according to claim 26 wherein said second line is formed on a same layer as at least one of a source and a drain electrode of said at least one thin film transistor.]

33. An active matrix type display device comprising:

a substrate having an insulating surface;

a plurality of pixel electrodes formed over said substrate[;] *with* at least one [first thin film transistor] *pixel electrode of said plurality of pixel electrodes being* electrically connected to [said pixel electrodes, respectively] *at least one thin film transistor*;

a driving circuit comprising at least one second thin film transistor for driving said first thin film transistor, formed over said substrate; *and* at least one wiring formed over said substrate for supplying a signal to said driving circuit from an external circuit;

wherein said wiring comprises a first line *formed on a same layer as at least one of a source and a drain electrode of said at least one thin film transistor*, and a second line formed over the first line with an insulating film interposed therebetween, said second line extending in parallel with and electrically connected to said first line through a plurality of contact holes opened in said insulating film.

34. The active matrix type display device according to claim 33 wherein said display device is a liquid crystal display device.

[35. The active matrix type display device according to claim 33 wherein said display device is an electroluminescence display advice.]

36. The active matrix type display device according to claim 33 wherein said first line comprises [at least one selected from the group consisting of aluminum, tantalum, polycrystalline silicon, and tungsten silicide] *a laminate structure of titanium and aluminum*.

[37. The active matrix type display device according to claim 33 wherein said second line comprises aluminum.]

[38. The active matrix type display device according to claim 33 wherein said first line is formed on a same layer as a gate electrode of said at least one thin film transistor.]

[39. The active matrix type display device according to claim 33 wherein said second line is formed on a same layer as at least one of a source and a drain electrode of said at least one thin film transistor.]

[40. An active matrix type display device comprising:

a substrate having an insulating surface;

a plurality of pixel electrodes formed over said substrate;

at least one thin film transistor electrically connected to said pixel electrodes, respectively;

a driving circuit comprising at least one second thin film transistor for driving said first thin film transistor, formed over said substrate;

at least one wiring formed over said substrate for supplying a signal to said driving circuit from an external circuit, said wiring comprising a first line and a second line formed over the first line with an insulating film interposed therebetween, wherein said second line extends in parallel with and is electrically connected to said first line through a plurality of contact holes opened in said insulating film, wherein said first line is formed on a same layer as a gate electrode of said first thin film transistor is formed.]

[41. The active matrix type display device according to claim 40 wherein said display device is a liquid crystal display device.]

[42. The active matrix type display device according to claim 40 wherein said display device is an electroluminescence display device.]

[43. The active matrix type display device according to claim 40 wherein said first line comprises at least one selected from the group consisting of aluminum, tantalum, polycrystalline silicon, and tungsten silicide.]

[44. The active matrix type display device according to claim 40 wherein said second line comprises aluminum.]

[45. The active matrix type display device according to claim 40 wherein said second line is formed on a same layer as at least one of a source and a drain electrode of said at least one thin film transistor.]

[46. An active matrix type display device comprising:

a substrate having an insulating surface;

at least one thin film transistor provided over the substrate, said thin film transistor having a gate electrode;

at least one of a source and a drain electrode electrically connected to said at least one thin film transistor;

a source line driving circuit formed over the substrate for driving said at least one thin film transistor, said source line driving circuit comprising:

a first wiring formed over said substrate wherein said first wiring comprises a same material as said gate electrode;

an interlayer insulating film formed over said at least one thin film transistor and said first wiring; and a second wiring formed on said interlayer insulating film wherein said second wiring comprises a same material as said at least one of the source and the drain electrode, wherein said second wiring extends in parallel with said first wiring and electrically connected to said first wiring via a plurality of contact holes opened in said interlayer insulating film.]

[47. The active matrix type display device according to claim 46 wherein said display device is a liquid crystal display device.]

[48. The active matrix type display device according to claim 46 wherein said display device is an electroluminescence display device.]

[49. The active matrix type display device according to claim 46 wherein said first wiring comprises at least one selected from the group consisting of aluminum, tantalum, polycrystalline silicon, and tungsten silicide.]

[50. The active matrix type display device according to claim 46 wherein said second wiring comprises aluminum.]

[51. The active matrix type display device according to claim 46 wherein said first wiring is formed on a same layer as said gate electrode of said at least one thin film transistor.]

[52. The active matrix type display device according to claim 46 wherein said second wiring is formed on a same layer as said at least on e of said source and drain electrode of said at least one thin film transistor.]

[53. An active matrix type display device comprising:

a substrate having an insulating surface;

at least one pixel electrode formed over the substrate;

at least one thin film transistor electrically connected to said pixel electrode, said thin film transistor having a gate electrode;

at least one of a source or a drain electrode electrically connected to the at least one thin film transistor;

a driving circuit formed over the substrate for driving said at least one thin film transistor, said driving circuit comprising:

a first wiring formed over said substrate wherein said first wiring comprises a same material as said gate electrode;

an interlayer insulating film formed over said first wiring;

a second wiring formed on said interlayer insulating film wherein said second wiring comprises a same material as said at least one of the source or the drain electrode, wherein said second wiring extends in parallel with said first wiring and electrically connected to said first wiring via a plurality of contact holes opened in said interlayer insulating film.]

[54. The active matrix type display device according to claim 53 wherein said display device is a liquid crystal display device.]

[55. The active matrix type display device according to claim 53 wherein said display device is an electroluminescence display device.]

[56. The active matrix type display device according to claim 53 wherein said first wiring comprises at least one selected from the group consisting of aluminum, tantalum, polycrystalline silicon, and tungsten silicide.]

[57. The active matrix type display device according to claim 53 wherein said second wiring comprises aluminum.]

[58. The active matrix type display device according to claim 53 wherein said first wiring is formed on a same layer as said gate electrode of said at least one thin film transistor.]

[59. The active matrix type display device according to claim 53 wherein said second wiring is formed on a same layer as said at least one of said source or drain electrode of said at least one thin film transistor.]

60. An active matrix type display device comprising:

a substrate having an insulating surface;

a plurality of pixel electrodes formed over said substrate[;] *with* at least one [thin film transistor] *pixel electrode of said plurality of pixel electrodes being* electrically connected to [said pixel electrodes, respectively] *at least one thin film transistor*; and at least [on e] *one* wiring formed over said substrate and connected to a flat cable;

wherein said wiring comprises a first line *formed on a same layer as at least one of a source and a drain electrode of said at least one thin film transistor*, and a second line formed over the first line with an insulating film interposed therebetween, said second line extending in parallel with and electrically connected to said first line through a plurality of contact holes opened in said insulating film.

61. The active matrix device according to claim 60 wherein said thin film transistor has a channel region comprising crystalline silicon.

62. The active matrix type display device according to claim 60 wherein said first line comprises [at least one selected from the group consisting of aluminum, tantalum, polycrystalline silicon, and tungsten silicide] *a laminate structure of titanium and aluminum*.

[63. The active matrix type display device according to claim 60 wherein said second line comprises aluminum.]

[64. The active matrix type display device according to claim 60 wherein said first line is formed on a same layer as a gate electrode of said at least one thin film transistor.]

[65. The active matrix type display device according to claim 60 wherein said second line is formed on a same layer as at least one of a source and a drain electrode of said at least one thin film transistor.]

[66. The active matrix display device according to claim 60 wherein said flat cable is connected to an external circuit.]

67. The active matrix type display device according to claim 60 wherein said display device is a liquid crystal display device.

68. The active matrix type display device according to claim 60 wherein said display device is an electroluminescence display device.

[69. An active matrix type display device comprising:

a substrate having an insulating surface;

a plurality of pixel electrodes formed over said substrate;

at least one thin film transistor electrically connected to said pixel electrodes, respectively; and at least one wiring formed over said substrate and connected to a flat cable, said wiring comprising a first line and a second line formed over the first line with an insulating film interposed therebetween, wherein said second line extends in parallel with and is electrically connected to said first line through a plurality of contact holes opened in said insulating film, wherein said first line is formed on a same layer as a gate electrode of said thin film transistor is formed.]

[70. The active matrix device according to claim 69 wherein said thin film transistor has a channel region comprising crystalline silicon.]

[71. The active matrix type display device according to claim 69 wherein said first line comprises at least one selected from the group consisting of aluminum, tantalum, polycrystalline silicon, and tungsten silicide.]

[72. The active matrix type display device according to claim 69 wherein said second line comprises aluminum.]

[73. The active matrix type display device according to claim 69 wherein said second line is formed on a same layer as at least one of a source and a drain electrode of said at least one thin film transistor.]

[74. The active matrix display device according to claim 69 wherein said flat cable is connected to an external circuit.]

[75. The active matrix, type display device according to claim 69 wherein said display device is a liquid crystal display device.]

[76. The active matrix type display device according to claim 69 wherein said display device is an electroluminescence display device.]

77. An active matrix type display device comprising:

a substrate having an insulating[,] surface;

at least one thin film transistor provided over the substrate, said thin film transistor having a gate electrode;

at least one of a source and a drain electrode electrically connected to said at least one thin film transistor; *and* a source line driving circuit formed over the substrate for driving said at least one thin film transistor, said source line driving circuit comprising:

a first wiring formed on a same layer as said [gate] *at least one of said source and said drain* electrode;

an interlayer insulating film [form ed] *formed* over said at least one thin film transistor and said first wiring; and a second wiring formed [on a same layer as said at least one of the source and the drain electrode] *over said interlayer insulating film*, wherein said second wiring extends in parallel with said first wiring and *is* electrically connected to said first wiring via a plurality of contact holes opened in said interlayer insulating film.

78. The active matrix type display device according to claim 77 wherein said first wiring comprises [at least one selected from the group consisting of aluminum, tantalum, polycrystalline silicon, and tungsten silicide] *a laminate structure of titanium and aluminum*.

[79. The active matrix type display device according to claim 77 wherein said second wiring comprises aluminum.]

80. The active matrix type display device according to claim 77 wherein said display device is a liquid crystal display device.

81. The active matrix type display device according to claim 77 wherein said display device is an electroluminescence display device.

82. An active matrix type display device comprising:

a substrate having an insulating surface;

at least one pixel electrode formed over the substrate;

at least one thin film transistor electrically connected to said pixel electrode, said thin film transistor having a gate electrode;

at least one of a source [or] *and* a drain electrode electrically connected to said at least one thin film transistor; *and* a driving circuit formed over the substrate for driving said at least one thin film transistor, said driving circuit comprising:

a first wiring formed on a same layer as said [gate] *at least one of said source and said drain* electrode;

an interlayer insulating film formed over said first wiring; and a second wiring formed [on a same layer as said at least one of the source or the drain electrode] *over said interlayer insulating film*, wherein said second wiring extends in parallel with said first wiring and electrically connected to said first wiring via a plurality of contact holes opened in said interlayer insulating film.

83. The active matrix type display device according to claim 82 wherein said first wiring comprises [at least one selected from the group consisting of aluminum, tantalum, polycrystalline silicon, and tungsten silicide] *a laminate structure of titanium and aluminum*.

[84. The active matrix type display device according to claim 82 wherein said second wiring comprises aluminum.]

85. The active matrix type display device according to claim 82 wherein said display device is a liquid crystal display device.

86. The active matrix type display device according to claim 82 wherein said display device is an electroluminescence display device.

*87. The active matrix type display device according to claim 1 wherein said second wiring functions as an auxiliary wiring.*

*88. The active matrix type display device according to claim 9 wherein said second wiring functions as an auxiliary wiring.*

*89. The active matrix type display device according to claim 18 wherein said second line functions as an auxiliary wiring.*

*90. The active matrix type display device according to claim 33 wherein said second line functions as an auxiliary wiring.*

*91. The active matrix type display device according to claim 60 wherein said second line functions as an auxiliary wiring.*

*92. The active matrix type display device according to claim 77 wherein said second wiring functions as an auxiliary wiring.*

*93. The active matrix type display device according to claim 82 wherein said second wiring functions as an auxiliary wiring.*

* * * * *